United States Patent
Chung et al.

[11] Patent Number: 5,843,831
[45] Date of Patent: Dec. 1, 1998

[54] PROCESS INDEPENDENT ALIGNMENT SYSTEM

[75] Inventors: Wen-Jye Chung, Hsin-Chu; Bor-Ping Jang, Ping Tung; Chih-Shih Wei, Hsin-Chu, all of Taiwan

[73] Assignee: Taiwan Semiconductor Manufacturing Company, Ltd., Hsin-Chu, Taiwan

[21] Appl. No.: 782,702

[22] Filed: Jan. 13, 1997

[51] Int. Cl.$^6$ .................................................. H01L 21/76
[52] U.S. Cl. ......................................... 438/401; 438/462
[58] Field of Search .................................. 438/401, 398; 257/759; 356/363

[56] References Cited

U.S. PATENT DOCUMENTS

| | | | |
|---|---|---|---|
| 3,752,589 | 8/1973 | Kobayashi | 356/172 |
| 4,046,985 | 9/1977 | Gates | 219/121 |
| 4,131,487 | 12/1978 | Pearce et al. | 148/1.5 |
| 4,534,804 | 8/1985 | Cade | 148/1.5 |
| 4,970,587 | 11/1990 | Abe | 348/94 |
| 4,996,763 | 3/1991 | Sano et al. | 29/593 |
| 5,034,684 | 7/1991 | Mitsui et al. | 324/754 |
| 5,189,502 | 2/1993 | Gomi | 257/759 |
| 5,200,798 | 4/1993 | Katagiri et al. | 356/363 |
| 5,408,320 | 4/1995 | Katagiri et al. | 356/363 |

OTHER PUBLICATIONS

S. Wolf, "Silicon Processing For The VLSI Era–vol. 2" Lattice Press, Sunset Beach, CA, p. 203, p. 476.
S. Wolf "Silicon Processing for the VLSI Era vol. 3—The submicron MOSFET", p. 373. Lattice Press, Sunset Beach, CA, USA, 1995.

*Primary Examiner*—Charles Bowers
*Assistant Examiner*—Craig Thompson
*Attorney, Agent, or Firm*—George O. Saile; Stephen B. Ackerman

[57] ABSTRACT

A method is disclosed for aligning wafers independent of the processes to which a wafer is subjected. In prior art, it is found that when aligning wafers from the front or device side, the alignment of the masks vary because of the variations on the topography of the particular layer in process. Since the topography of a layer is influenced by the planarization processes used and by the cumulative effect of the number of underlying features that are disposed on top of each other, severe misalignments can occur causing defective parts. The problem is eliminated by forming alignment marks on the backside of the wafer, and performing alignment with respect to the backside marks by projecting IR energy through an IR transparent stage placed under the backside of the wafer and using an IR microscope. An alignment system capable of performing process independent alignment is also disclosed.

17 Claims, 2 Drawing Sheets

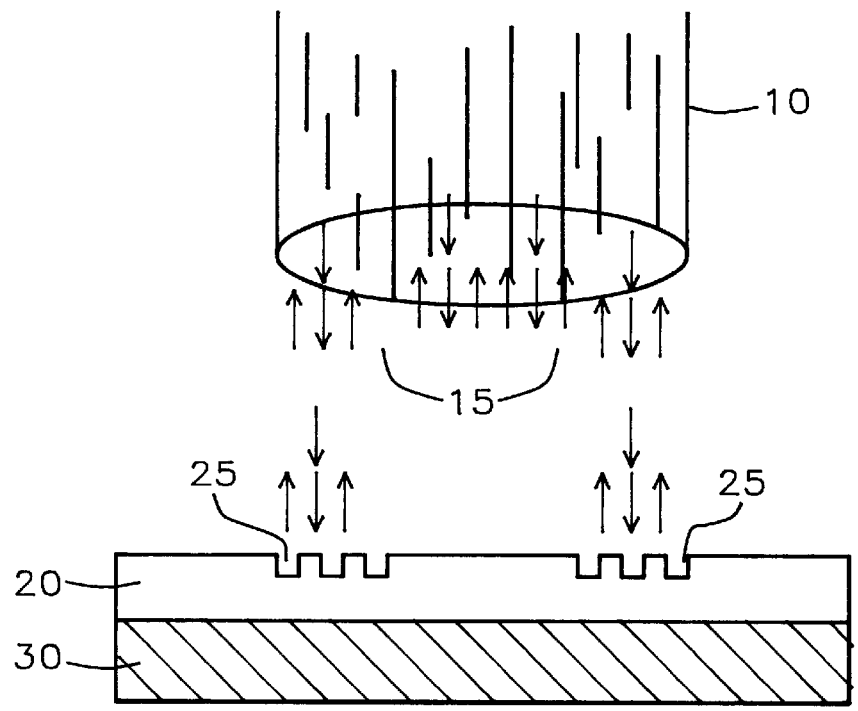
*FIG. 1a - Prior Art*
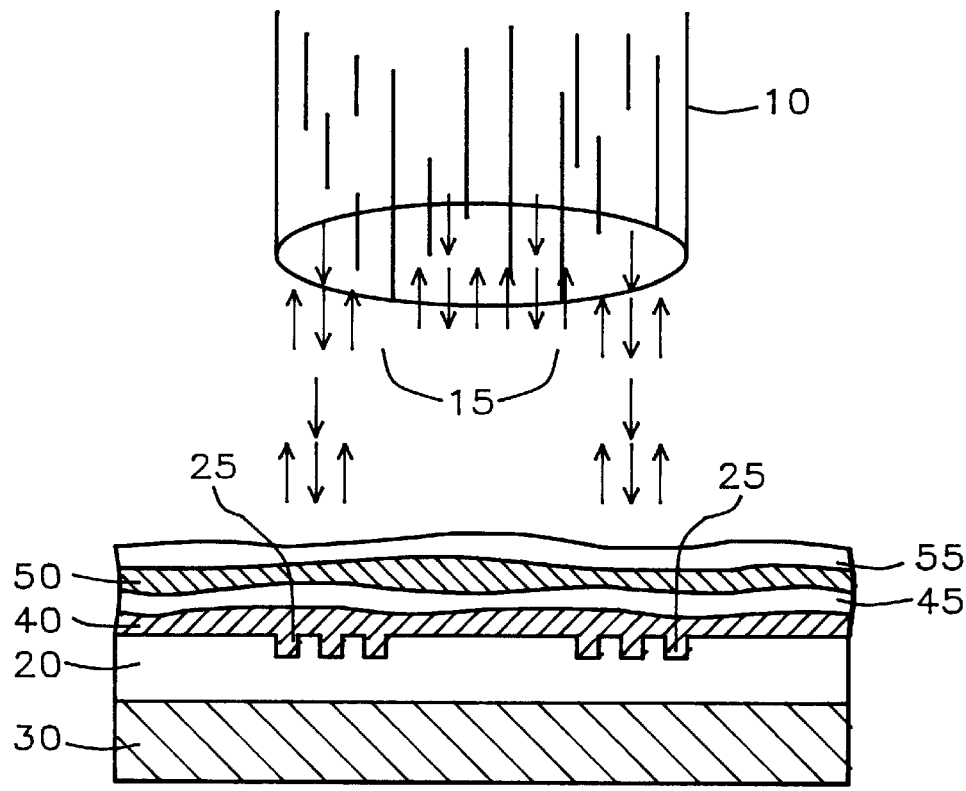
*FIG. 1b - Prior Art*

PROCESS INDEPENDENT ALIGNMENT SYSTEM

BACKGROUND OF THE INVENTION (1) Field of the Invention

The present invention relates generally to aligning wafers, and in particular, to aligning wafers independent of the processes that are employed in the manufacture of integrated circuits.

(2) Description of the Related Art

Of the multiplicity of processes that are employed in the manufacture of integrated circuits on semiconductor wafers, many affect the materials that are exposed to them in ways that influence the subsequent process steps. It is known, for example, that the edge profile of features, such as metal lines on a layer in a wafer, will vary depending upon the selectivity of etchant used for that particular metal on that particular layer. Also, metals will experience discoloration as a result of being exposed to chemical etchants. Both variations in the geometrical edge profile, and in the refraction and reflectivity of metals will yield variable and unreliable signal outputs when such signals are used to control a particular process. For example, optical aligners use signals arising from stepping over an edge of a metal line, or from refractivity through a transparent layer or reflectivity from a surface in aligning masks with respect to alignment marks on a wafer.

Alignment marks and aligning wafers with respect to those marks are an important part of the process of manufacturing semiconductor devices and integrated circuits. As is known in the art, integrated circuits are fabricated by patterning a sequence of masking layers, and the features on successive layers bear a spatial relationship to one another. Thus, as a part of the fabrication process each level must be aligned to the previous levels. Alignment of one pattern layer to previous layers is done with the assistance of special alignment patterns designed on to each mask level. When these special patterns are aligned, it is assumed that the remainder of the circuit patterns are also correctly aligned. Since each layer must have alignment marks for proper registration with respect to the next layer, each alignment or registration then becomes dependent upon the particular process used on that layer.

The tools that are used to pattern the various layers in a wafer are known as photomasks or masks and reticles. The patterns on the mask or the reticle are defined by a combination of opaque and translucent areas. A light source through the mask or the reticle projects the patterns onto the surface of a wafer, and depending upon the material that is being exposed to the light, the pattern is transferred on to the surface where the light arrives or not. A mask contains patterns that can be transferred to an entire wafer in one exposure. A reticle, on the other hand, contains a pattern image which must be stepped and repeated in order to expose an entire substrate.

The adjustment of the image of the mask being exposed to the previously produced patterns was originally performed by human operators, who compared the image locations under a microscope and adjusted the position of the mask to bring it into alignment with wafer patterns. Decreasing feature sizes, and the increasing number of alignments per wafer with step-and-repeat projection aligners, have been the impetus for developing automatic alignment systems. The principle of one type of automatic alignment procedure is illustrated on page 476 of S. Wolf's book, "Silicon Processing for the VLSI Era," vol. 2, Lattice Press, Sunset Beach, Calif., 1990. Alignment marks consisting of two rectangular patterns, each set at a 45° angle to the directions of the motion an xy-stage table are fabricated on a wafer. Two corresponding rectangular patterns are located on the reticle of an optical aligner, and their image is projected onto the wafer. The superimposed alignment target and the reticle image are reflected back into the main optical element of the aligner, and then into an on-axis microscope. The image from the microscope is focused onto the face of a TV camera, and is subsequently digitized into a form that can be analyzed by a computer. When alignment is achieved, a signal is generated. The 45° orientation of the alignment marks makes it possible to obtain both x an y registration information from the horizontal scan-lines of the video camera. The relative position of the wafer marks with respect to the reticle windows determines the registration of the two images.

Registration and alignment in wafer steppers are performed globally and locally. Global alignment performs rotational and translational alignment of the entire wafer, while local alignment provides alignment to a target within a particular region of a pattern image on the wafer. Global alignment is usually accomplished at a remote alignment station before a wafer is moved under the projection lens for exposure. An apparatus for global aligning is disclosed in U.S. Pat. No. 4,046,985, though for a different purpose other than for aligning masks. The aforementioned apparatus aligns the wafer to a fixed reference position, inverts the aligned wafer to expose its backside and transfers it with controlled motion to a set position under a laser apparatus. The laser beam scans the backside of the wafer to create in a kerf area between chip sites on the wafer an easily breakable cut for the purpose of subsequently separating and removing the chips. This method of aligning differs from the method that will be disclosed in the present invention.

U.S. Pat. No. 3,752,589 discloses a method of aligning the pattern of a photomask on one side of a wafer to the patterns placed on the underside of the wafer. The alignment of the mask with respect to the wafer is achieved by optically superimposing the images present on the mask and on the underside of the wafer and adjusting the mask relative to the wafer until the relative positions of the combined images are corrected to a predefined set of conditions. This method requires two viewing apparatus: one for the mask facing the wafer and the other on the opposing side facing the underside of the wafer, which is superfluous in the present invention as disclosed later in a preferred embodiment.

Cade, in U.S. Pat. No. 4,534,804, on the other hand, teaches a method of forming a laser alignment mark such that same mark now extending, after heat treatment, to both the front and the back of the wafer can be used to align photoresist photomasks to both the front and the back side of a silicon wafer. The alignment mark that is formed is actually a defect planted into the wafer by means of a laser beam. The wavelength of the laser beam is chosen such that it passes through the lightly doped wafer without absorption but is absorbed by a following heavily doped semiconductor layer to generate therein heat and resulting defect. The semiconductor wafer is then heated to cause the defects to migrate through a lightly doped epitaxial layer to the front surface thereof in which there is formed an identically positioned image of the mark scribed on the back side. It will be appreciated, however, that this method is limited to contiguous semiconductor materials without any intervening other types of layers. It is of interest to note that laser beam generated defects are also exploited in gettering or attracting unwanted mobile defects away from device areas in semiconductor wafers as disclosed in U.S. Pat. No. 4,131,487.

Generally, the process of aligning masks in fabricating semiconductor devices in a substrate, and, subsequently, in "metallizing" or wiring the devices together to form integrated circuits on the substrate require different considerations. Up to the level where devices are fabricated, the alignment of masks is accomplished by projecting infrared rays from the underside of the wafer while observing the patterns by an infrared microscope. But this method is not applicable when metallized layers are present because metallic films are opaque to infrared rays. Similarly, the method of U.S. Pat. No. 4,534,804 cannot applied since the metallized layer would preclude the migration of a laser defect through it.

The process of metallization, or "personalization" requires the patterning of the metal layers to form the desired circuit pattern. This is accomplished by masking the metal layer with a photosensitive emulsion and then positioning a photographic mask thereon. The emulsion is next exposed to ultraviolet rays though the photographic mask and then the emulsion is developed and the unexposed emulsions is washed away with solvent. The exposed metal areas are then etched to form wiring patterns corresponding to those on the mask. Certain predetermined areas on the metal layer do also contain alignment marks for registration with the next level of metal layer to be deposited.

Before the next metal layer is deposited, however, an interlevel layer of a dielectric insulator is first blanket deposited over the wiring layer. An interlevel layer usually will form a relatively rough topography conforming to the geometrical features of the underlying layer. Since the depth-of-field limitations of submicron optical-lithography tools require surfaces to be planar within ±0.5 micrometers (See S. Wolf and R. N. Tauber, "Silicon Processing for the VLSI Era," vol. 2, Lattice Press, Sunset Beach, Calif., 1990, p. 203), planarization, as is well known in the field, of the dielectric layer will also be required if optical lithography is to be usable for fabricating integrated circuits with submicron feature sizes of today. Conventionally, planarization is performed in any number of ways including mechanical polishing, or a combination of mechanical and chemical polishing, called CMP. It will be appreciated that as more layers of metal and interlevel dielectric are deposited, the surface topography of each layer will vary because of the cumulative effect of the number of underlying features that are disposed on top of each other. Furthermore, the particular planarization process used, including CMP, will result in different topographic features of that layer. Hence, the photographic alignment of masks of each layer to the preceding layer will depend upon the nature of the planarized surfaces of each layer, and therefore will vary accordingly. A method is disclosed in this invention where the process dependency of alignment is eliminated.

To appreciate the process dependency of alignment and its effects thereof, FIGS. 1a and 1b show a conventional system where wafer (20) is disposed between a movable xy-stage (30) and an alignment source (10). The rays emanating from source (10) are shown by numeral (15) in both FIGS. 1a and 1b. In FIG. 1a, wafer (20) is provided with alignment marks in a wiring layer (not shown), and in FIG. 2a, with two levels of metal (40) and (50), wiring layers. First and second metal layers, (40) and (50), respectively, are separated by an interlevel dielectric layer (45), and second layer (50) has on it dielectric layer (55). As is commonly used in the manufacture of semiconductor wafers, the interlevel dielectric layers (45) and (55) shown in FIG. 1b are spin-on-glass, or SOG. For the reasons given earlier, both of the dielectric layers are subjected to planarization by means of chemical-mechanical polishing before the respective metals layers are deposited thereon. However, it will be noted that the roughness or non-planarity of second dielectric layer (55) is more pronounced than that of the first layer (45). This is because, as the number of metal interconnect levels are increased, the stacking of additional layers on top of one another produces a more and more rugged topography as mentioned earlier. Although polishing process creates more planarity, nonetheless, the remaining non-planarity varies from one layer to another depending upon the cumulative effect on the topography of the underlying layer. As a result, the patterns on layer (50) visible through the second interlevel layer (55), for example, are more diffused and not as clear as the patterns on layer (40) are through layer (45). Furthermore, the depth-of-field varies from layer to layer on the optical-lithography tools that are used for aligning masks over different layers. Consequently, the signals generated by the edges of the patterns on metal layers vary depending upon the planarity of the layer over which a mask is placed. In other words, the signals for aligning masks over patterns and alignment marks on a wafer are process dependent, and are sometimes weak, and at other times not distinct so as to cause misalignment and therefore product defects. What is needed, therefore, is a method whereby the aligning and alignment signals are independent of processes used and that the alignment signal strength is invariant throughout the manufacture of a semiconductor substrate.

SUMMARY OF THE INVENTION

It is therefore an object of this invention to provide a process independent alignment system for manufacturing semiconductor wafers.

It is another object of this invention to provide a method for aligning masks accurately over semiconductor wafers with backside alignment marks.

It is still another object of this invention to provide an apparatus having a transparent chuck, or stage, for back-sided alignment of wafers in the manufacture of substrates.

In accordance with the aforementioned objects, there is provided a method for forming marks on the back-side of wafers; mounting the wafer on an IR transparent chuck or movable stage; projecting infrared rays from an alignment tool on the underside of the stage towards the alignment marks of the wafer; and aligning the marks on the back-side of the wafer to a predetermined set of marks on a mask or on the reticle of the alignment tool.

In accordance with the aforementioned objects, there is also provided an alignment system having an infrared (IR) transparent wafer stage; and an IR alignment tool.

BRIEF DESCRIPTION OF THE DRAWINGS

The objects and features of this invention will become apparent more readily from a reading of the detailed description in conjunction with the drawings that follow:

FIG. 1a is a schematic drawing of a prior art alignment source in relation to a wafer containing conventional alignment marks and placed on a conventional stage.

FIG. 1b is a schematic drawing of a prior art alignment source in relation to a wafer containing conventional alignment marks and a plurality of metal layers, and placed on a conventional stage.

DESCRIPTION OF THE PREFERRED EMBODIMENTS

Figure 2A:
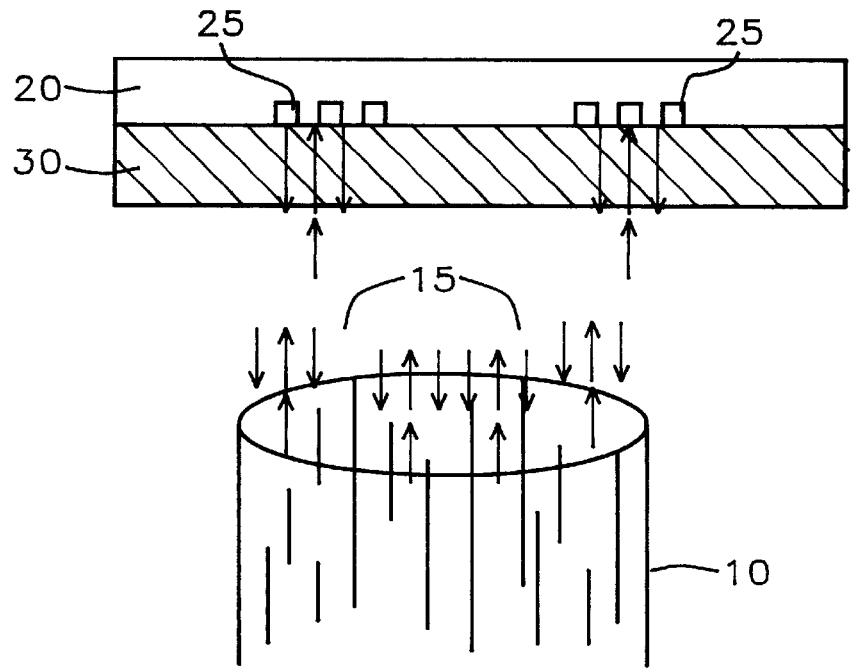
FIG. 2a is a schematic drawing of an alignment source in a new relationship to a wafer having new back-side alignment marks according to this invention, and placed on a transparent stage of this invention.
Figure 2B:
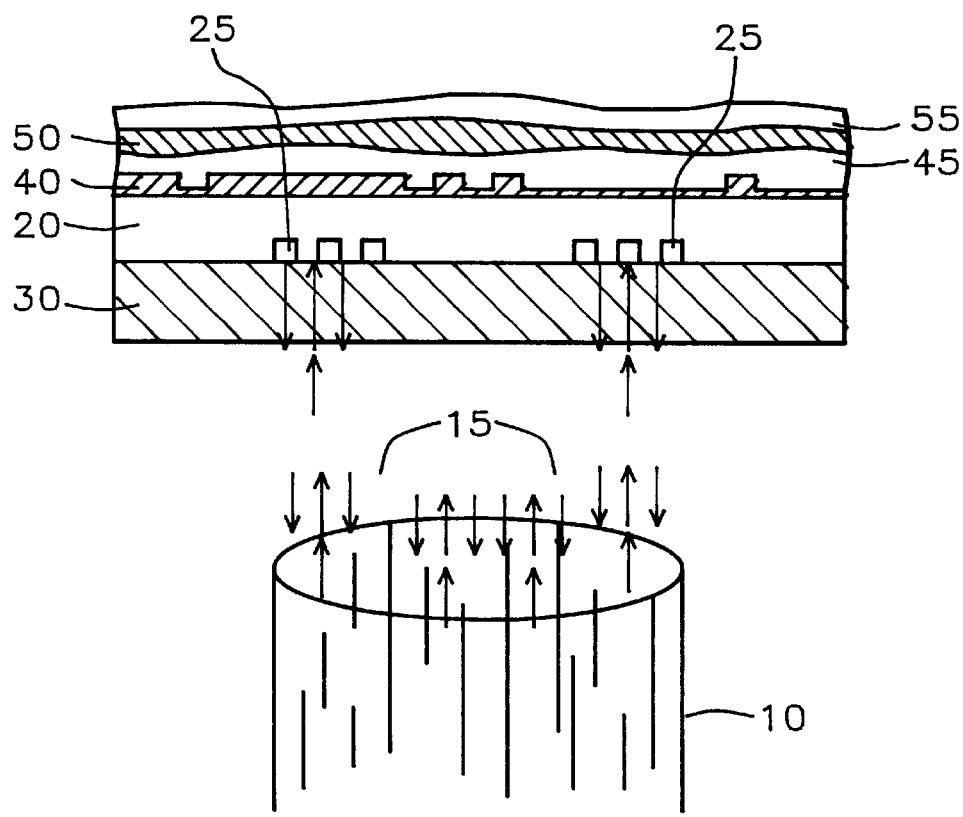
FIG. 2b is a schematic drawing of an alignment source in a new relationship to a wafer containing a plurality of metal layers and having new back-side alignment marks according to this invention, and placed on a transparent stage of this invention.

Referring now to the drawings, in particular to FIGS. 2a and 2b, there are shown wafers (20) which have been positioned in relation to an aligner with a light source (10). Optical aligners used in semiconductor manufacturing are well known in the art and as they are not significant to the invention, they are not described in detail here in order not to unnecessarily obscure the present invention. Usually, the beam source used in the aligner is a helium-neon (HeNe) laser. In another embodiment, it is preferred that of the electromagnetic spectrum emitted by the beam source, the wavelength utilized is in the infrared (IR) range. It will be noted that visible light is bounded on either side of the electromagnetic spectrum by IR and ultraviolet radiation (UV), the former having longer and the latter shorter wavelength than that of the visible light whose wavelength lies between about 45 to 65 nanometers.

Source (10) is placed under wafer (20), because it is preferred that alignment is made from the backside of the wafer. Alternately, beam bending can be used while positioning source on the front side. The advantage of aligning from the backside becomes apparent once it is realized that the various alignments that are necessary during the course of fabricating a wafer become unaffected by the many processes to which the front of the wafer is subjected. That is, alignment performed by viewing alignment marks from the front side of the wafer is continuously degraded as more layers are added after having formed the semiconductor devices. This is avoided by providing alignment marks on the backside of the wafer, which is a key element of this invention. Further, it is also provided that the stage, or a movable xy-table is transparent to infrared energy, which again is a main feature and key spirit of the present invention. In another embodiment, holes are provided on the xy-stage through which light can pass. This has the added advantage that the stage can be made of ceramic or other metallics.

Backside alignment marks (25) are shown in FIG. 2a. They can be of any convenient shape and dimensions. They reflect infrared energy.

A movable xy-table, or stage (30) holds wafer (20) to be aligned. In order to allow the optical alignment be achievable from underside of wafer (20), an important feature of the present invention is the physical properties of stage (30). It is preferred that wafer (20) is held on to a movable xy-stage made of a high transmittance material such as fused quartz which is transparent to IR rays. Furthermore, stage (30) is fitted with appropriate means for holding the wafer securely onto the stage.

While the invention has been particularly shown and described with reference to the preferred embodiments thereof, it will be understood by those skilled in the art that various changes in form and details may be made without departing from the spirit and scope of the invention.

What is claimed is:

1. A method of aligning wafers comprising the steps of:
providing a semiconductor wafer having a top surface and a bottom surface;
forming an alignment mark on the bottom surface of said semiconductor wafer;
placing said semiconductor wafer on a movable stage having apertures to allow radiant energy to pass through;
focusing and aligning said radiant energy through said apertures onto said alignment marks on the bottom surface of said semiconductor wafer; and
performing alignment according to said alignment mark using said radiant energy.

2. A method for aligning wafers comprising the steps of:
providing a semiconductor wafer having devices formed within and on its surface and with an oxide layer thereover;
forming patterns on backside of said wafer;
depositing a first interlevel dielectric layer over said oxide layer;
planarizing said first dielectric layer;
depositing a first metal layer on said first dielectric layer;
depositing a photoresist on said first metal layer;
placing said wafer on a stage;
positioning an aligner beam source underside said stage thereat;
focusing and aligning said beam source on said patterns on backside of said wafer;
forming patterns on said first metal layer; and
repeating the steps above for additional metal layers.

3. The method of claim 2, wherein said wafer is silicon substrate.

4. The method of claim 2, wherein said oxide layer is silicon oxide.

5. The method of claim 2, wherein said patterns are alignment marks.

6. The method of claim 5, wherein said alignment marks are located on the said backside of said wafer.

7. The method of claim 2, wherein said first dielectric layer is spin-on-glass (SOG).

8. The method of claim 2, wherein said planarization is chemical-mechanical polishing (CMP).

9. The method of claim 2, wherein said metal is blanket deposited.

10. The method of claim 2, wherein said photoresist is blanket deposited.

11. The method of claim 2, wherein said stage is a movable xy-table.

12. The method of claim 2, wherein said stage is transparent to infrared energy.

13. The method of claim 2, wherein said stage is of high transmittance material.

14. The method of claim 2, wherein said wafer is secured to said stage by means of a vacuum chuck.

15. The method of claim 2, wherein said aligner beam source is in the infrared range and is positioned in a normal direction to said stage.

16. The method of claim 2, wherein said focusing is accomplished with respect to said alignment marks on said backside of said wafer.

17. The method of claim 2, wherein said alignment is accomplished with respect to patterns in said aligner.

* * * * *